United States Patent
Yang et al.

(10) Patent No.: US 11,402,265 B2
(45) Date of Patent: Aug. 2, 2022

(54) APPARATUS FOR INTEGRATED OFFSET VOLTAGE FOR PHOTODIODE CURRENT AMPLIFIER

(71) Applicant: Texas Instruments Incorporated, Dallas, TX (US)

(72) Inventors: Tianhong Yang, Dallas, TX (US); Grant Evan Falkenburg, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/674,758

(22) Filed: Nov. 5, 2019

(65) Prior Publication Data
US 2021/0131865 A1    May 6, 2021

(51) Int. Cl.
| | |
|---|---|
| G01J 1/44 | (2006.01) |
| G01J 1/46 | (2006.01) |
| G01N 15/06 | (2006.01) |
| H03F 3/45 | (2006.01) |

(52) U.S. Cl.
CPC ........... *G01J 1/46* (2013.01); *G01N 15/06* (2013.01); *H03F 3/45* (2013.01); *G01N 2015/0693* (2013.01)

(58) Field of Classification Search
CPC ..... H05B 45/10; H03F 1/0222; H03F 1/0227; H03F 3/45; H03F 2203/45; G01J 1/1626; G01J 1/4204; G01J 1/44; G01J 2001/44; H03K 17/74; H03K 4/696; G01N 15/06; G01N 21/01; G01N 21/17

USPC ............................................. 250/214 R, 221
See application file for complete search history.

(56) References Cited

U.S. PATENT DOCUMENTS

| | | | |
|---|---|---|---|
| 4,445,031 A * | 4/1984 | Kamoshida | G11B 15/08 250/214 RC |
| 5,982,158 A | 11/1999 | Schnars | |
| 8,362,842 B1 | 1/2013 | Xu | |
| 8,510,068 B2 | 8/2013 | Kawashima | |
| 9,148,094 B1 | 9/2015 | Swoboda | |
| 9,438,353 B2 | 9/2016 | Yun et al. | |

(Continued)

FOREIGN PATENT DOCUMENTS

| | | |
|---|---|---|
| CN | 105045185 A | 11/2015 |
| CN | 204991123 U | 1/2016 |

(Continued)

*Primary Examiner* — Que Tan Le
(74) *Attorney, Agent, or Firm* — Ray A. King; Charles A. Brill; Frank D. Cimino

(57) ABSTRACT

An example apparatus includes: a first voltage source, a first amplifier having a noninverting input adapted to be coupled to a photodiode anode and coupled to the first voltage source, an inverting input adapted to be coupled to a photodiode cathode, and an output, a first resistor coupled to the first amplifier inverting input and to the first amplifier output, a first capacitor coupled to the inverting input of the first amplifier and the first amplifier output, and a second voltage source different from the first voltage source. There is a second amplifier having a noninverting input, an inverting input and an output. The noninverting input is coupled to the output of the first amplifier, the inverting input is coupled to the second voltage source, and there is a second resistor coupled to the inverting input and the output of the second amplifier.

20 Claims, 2 Drawing Sheets

(56) References Cited

U.S. PATENT DOCUMENTS

| | | |
|---|---|---|
| 9,710,001 B2 | 7/2017 | Smith et al. |
| 9,958,885 B2 | 5/2018 | Smith et al. |
| 2005/0276080 A1 | 12/2005 | Okada |
| 2006/0184847 A1 | 8/2006 | Song |
| 2008/0007344 A1 | 1/2008 | Natzke |
| 2011/0283141 A1 | 11/2011 | Lee |
| 2012/0161733 A1 | 6/2012 | Hua |
| 2013/0076324 A1 | 3/2013 | Fujii |
| 2013/0116534 A1 | 5/2013 | Woo |
| 2016/0232781 A1 | 8/2016 | Sangha et al. |
| 2016/0299518 A1 | 10/2016 | Iwata |
| 2017/0287309 A1 | 10/2017 | Gerbus |
| 2017/0351285 A1 | 12/2017 | Iwata |

FOREIGN PATENT DOCUMENTS

| | | |
|---|---|---|
| CN | 205787995 U | 12/2016 |
| GB | 2558877 A | 7/2018 |
| JP | 01248197 A | 10/1989 |
| JP | 03100814 A | 4/1991 |
| RU | 2611021 C2 | 12/2016 |
| WO | 2018222905 A9 | 12/2018 |
| WO | 2019051815 A1 | 3/2019 |

\* cited by examiner

APPARATUS FOR INTEGRATED OFFSET VOLTAGE FOR PHOTODIODE CURRENT AMPLIFIER

BACKGROUND

Photoelectric smoke detector systems use a light source and a light detector in a light-shielded environment that is designed to keep ambient light out. The light detector is a photodiode that outputs a current that is proportional to the intensity of the light incident upon the photodiode. The light source may emit infrared, visible or ultraviolet light. The components of the smoke detector system are arranged inside a chamber designed to exclude extraneous ambient light but allow sufficient air flow.

The light source for the smoke detector is positioned to emit collimated light at an angle to the light sensor. During normal operation without the presence of smoke particles, no light from the source will be incident on the photodiode because the light will travel in a straight line, never bending downward toward the photodiode detector. However, if smoke enters the air chamber, smoke particles will scatter the light beam and deflect some of the light onto the photodetector. When light hits the photodetector, the photodiode will output a current proportional to the amount of light reflected onto the photodiode.

SUMMARY

This Summary is provided to introduce the disclosed concepts in a simplified form that are further described below in the Detailed Description including the drawings provided. This Summary is not intended to limit the claimed subject matter's scope.

Disclosed embodiments describe an apparatus comprising a first stage amplifier having a noninverting input, an inverting input, and an output. The noninverting input is adapted to be coupled to an anode of a photodiode and is coupled to a first stage bias voltage source. The inverting input is adapted to be coupled to a cathode of the photodiode, and is coupled to a first terminal of a feedback resistor, and a first terminal of a feedback capacitor. The output is coupled to a second terminal of the feedback resistor and a second terminal of the feedback capacitor.

The apparatus also comprises a second stage amplifier having a noninverting input, an inverting input and an output. The noninverting input is coupled to the output of the first stage amplifier. The inverting input is coupled to a first terminal of a feedback resistor and a second stage bias voltage source. The output is coupled to a second terminal of the feedback resistor.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

The amount of light being deflected onto a photodiode detector from smoke particles in a photoelectric smoke detector system is small. As a result, the difference in current output from a photodiode between a clean air condition and in the presence of smoke is typically in the nanoampere range. In addition to the light scattered from smoke particles which the photoelectric smoke detection system is intended to detect, the photodiode may also pick up stray ambient light. This adds a baseline current to the output of the photodiode. In an environment with no stray ambient light, the baseline signal level of a photodiode output can be under a nanoampere.

This small photocurrent is converted into a voltage using a high gain low noise amplifier. In at least one embodiment, the output of the amplifier may be coupled to an analog-to-digital converter (ADC) in a microcontroller. Operations may be performed on the data in the microcontroller to reduce the ambient light contribution. It is desirable for the amplifier to always operate in the linear region where a sub-nanoampere signal can be detected when there is no baseline current resulting from ambient light incident on the photodiode.

A problem that may arise with photocurrent amplifiers is that their output can be saturated even without a signal input. This saturation can occur due to an amplifier's inherent offset voltage being gained up by the amplifier, which can cause the amplifier output to remain at either a supply rail voltage or at ground. When the output of an amplifier is saturated, a small fluctuation on the input will not be seen or be measurable on the output.

Figure 1:
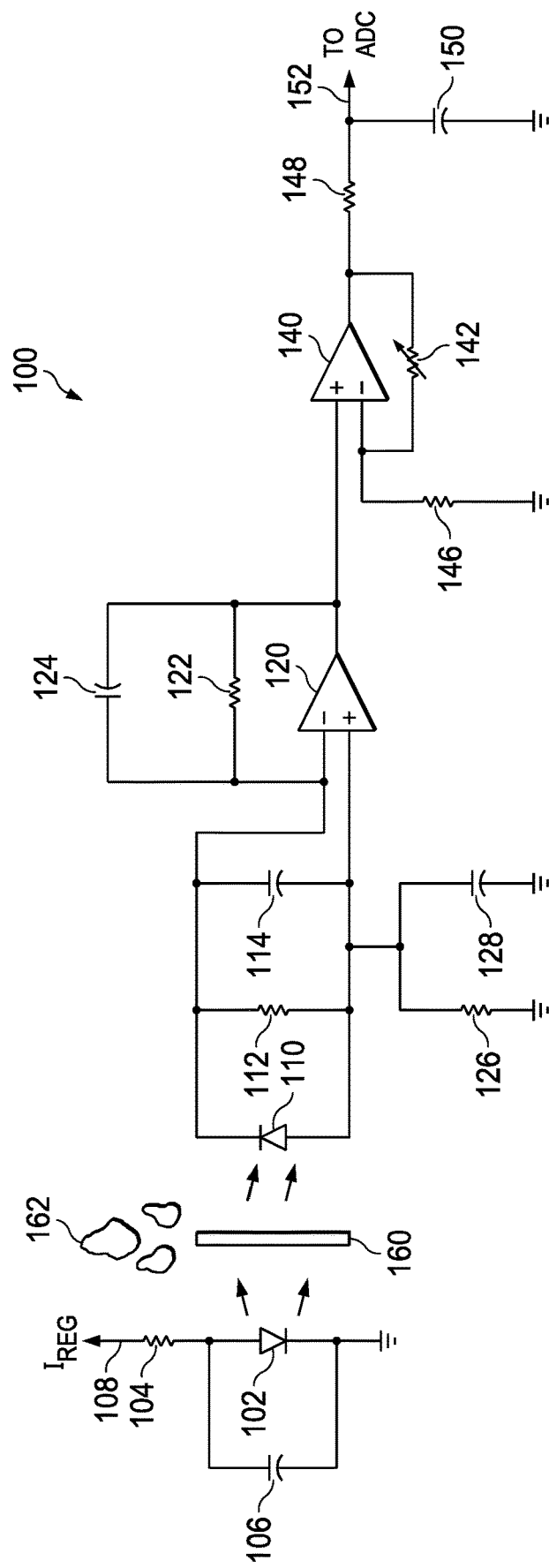
FIG. 1 shows a block diagram for one example of a prior art photoelectric smoke detector amplifier circuit with a two-stage photo amplifier referenced to ground.

FIG. 1 illustrates a block diagram for an example of a photoelectric smoke detector amplifier circuit 100 with a two-stage photo amplifier referenced to ground. Light emitting diode (LED) 102, which is supplied by a regulated current source 108, emits light into a smoke detector air chamber. The light from LED 102 may be infrared or may be visible light. Isolation barrier 160 shields photodiode 110 from receiving the light from LED 102 directly. When air entering the smoke detector air chamber is free of smoke, light from LED 102 does not have a path to get to the photodiode 110.

However, when smoke enters the smoke detector air chamber, smoke particles 162 can drift into the space over the isolation barrier 160. Some of the light from LED 102 reflects off the smoke particles 162 and onto the photodiode 110, bypassing the isolation barrier 160. The higher the concentration of smoke particles 162, the more light from LED 102 is reflected onto photodiode 110. As a result, photodiode 110 emits a current proportional to the concentration of smoke particles 162 in the proximity of the isolation barrier 160. Because the amount of light from LED 102 that reflects off the smoke particles 162 onto the photodiode 110 is small, the current emitted by photodiode 110 is small. This small photocurrent is converted into a voltage by a high gain, low noise amplifier to make the signal readable by an analog-to-digital converter.

The cathode of photodiode 110 is coupled to a first terminal of a resistor 112, a first terminal of a capacitor 114, and an inverting input of amplifier 120. The anode of photodiode 110 is coupled to a second terminal of a resistor 112, a second terminal of a capacitor 114, and a noninverting input of amplifier 120. A resistor 122 and a capacitor 124 are connected in parallel providing a feedback loop between the inverting input of amplifier 120 and the output of amplifier 120.

There is also a resistor 126 and a capacitor 128 connected in parallel between the noninverting input of amplifier 120 and ground. This provides an input reference voltage for amplifier 120 at ground.

The output of amplifier 120 is coupled to a noninverting input of amplifier 140. A resistor 146 is coupled between an inverting input of amplifier 140 and ground. A variable resistor 142 is coupled in a feedback loop between the output of amplifier 140 and the inverting input of amplifier 140, making amplifier 140 a variable gain amplifier. In at least one example, the value of variable resistor 142 can be programmed using a control register.

The output of amplifier 140 can be coupled to an ADC. The amplifier output may be coupled to the ADC through a low pass filter. Resistor 148 is coupled to the output of amplifier 140 and to capacitor 150, which is also coupled to ground, together making up that low pass filter.

Amplifier 120 and amplifier 140 are both referenced to ground, which can lead to a problem in some instances. Linear amplifiers may have an input offset voltage that can be negative. If the amplifier input is referenced to ground, the amplifier output may saturate at ground even with no signal input. This prevents small input signals, such as the nanoamp current from a photodiode, from being measurable because the output will not change with the input if the amplifier is saturated.

Figure 2:
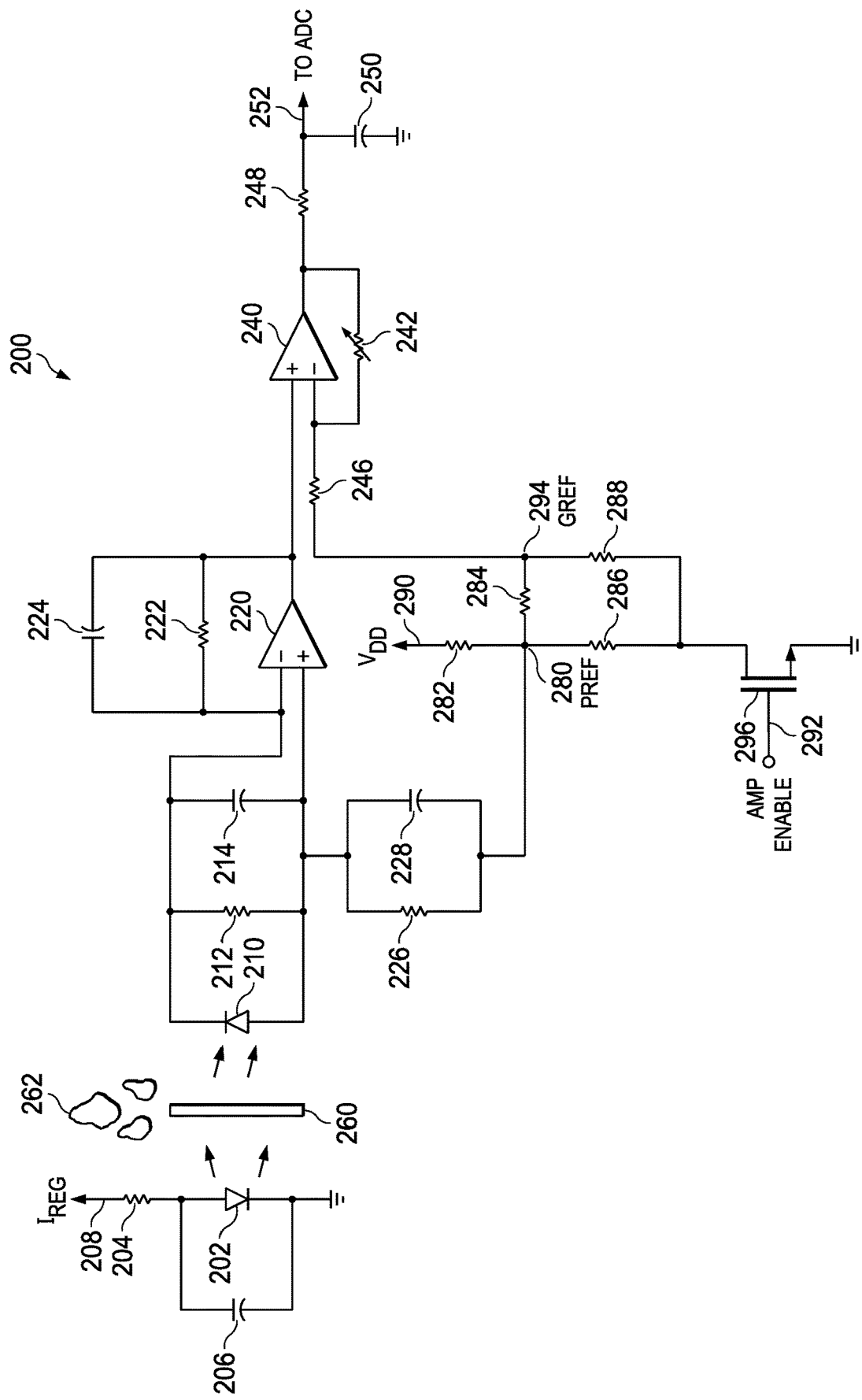
FIG. 2 shows a block diagram for one example of a photoelectric smoke detector amplifier circuit with a two-stage photo amplifier having two bias voltage references as claimed.

FIG. 2 illustrates a block diagram for one embodiment of a two stage photoelectric smoke detector amplifier circuit with two references. The voltages for the two reference voltage sources are selected to reduce the input offset voltage of each amplifier for the purpose of avoiding amplifier saturation.

Referring to FIG. 2, one embodiment of a photoelectric smoke detector amplifier circuit with a two-stage photo amplifier circuit 200 having two separate reference voltages for the two stages, PREF 280 and GREF 294, is shown. LED 202 is supplied by a regulated current source 208 and emits light into a smoke detector air chamber. Photodiode 210 outputs a current proportional to the intensity of light incident upon it.

The light emitted by LED 202 may be infrared or may be visible light. An isolation barrier 260 shields photodiode 210 from receiving the light from LED 202 directly. When air entering the smoke detector is free of smoke, light from LED 202 does not have a path to get to photodiode 210.

If smoke enters the smoke detector air chamber, smoke particles 262 can drift into the space around the isolation barrier 260. Some of the light from LED 202 can reflect off the smoke particles 262 and onto the photodiode 210, bypassing the isolation barrier 260. Thus, the smoke particles 262 provide a path for some of the light from LED 202 to make it to the photodiode 210. The higher the concentration of smoke particles 262, the more light from LED 202 is reflected onto photodiode 210. As a result, the photodiode 210 emits a current proportional to the concentration of smoke particles 262 in the proximity of the isolation barrier 260. Because the amount of light from LED 202 that reflects off the smoke particles 262 onto the photodiode 210 is small, the current emitted by photodiode 210 is also small. This small photocurrent is converted into a voltage by a high gain, low noise amplifier to make the signal readable by an analog-to-digital converter.

The cathode of photodiode 210 is coupled to a first terminal of a resistor 212, a first terminal of a capacitor 214, and an inverting input of an amplifier 220. The anode of photodiode 210 is coupled to a second terminal of a resistor 212, a second terminal of a capacitor 214, and a noninverting input of amplifier 220. A resistor 222 and a capacitor 224 are connected in parallel between the inverting input of amplifier 220 and the output of amplifier 220.

Linear amplifiers, such as amplifiers 220 and 240, can have an input offset voltage. If the input offset voltage is negative, the input offset voltage may saturate the output of the amplifier at ground with no input signal to the amplifier if the amplifier input is referenced to ground. This may prevent small input signals, such as the photocurrent that is being input to amplifier 220, from being measurable because the output will not change as the input changes. In one embodiment of the invention, two voltage references are generated, one for the input of each amplifier stage. The values of the two reference voltages are selected to counteract the input offset voltage of each amplifier.

A resistor 226 and a capacitor 228 are connected in parallel with one of their terminals coupled to the noninverting input of amplifier 220. The other terminals of resistor 226 and capacitor 228 are coupled to a node PREF 280 which provides an input reference voltage for amplifier 220.

The output of amplifier 220 is coupled to a noninverting input of amplifier 240. A variable resistor 242 is coupled in a feedback loop between the output of amplifier 240 and the inverting input of amplifier 240, making amplifier 240 a variable gain amplifier. In at least one embodiment, the value of variable resistor 242 can be programmed using a control register. In an alternative embodiment, resistor 242 may be a fixed value resistor.

One terminal of a resistor 246 is coupled to the inverting input of amplifier 240. The other terminal of resistor 246 is coupled to a node GREF 294 which provides an input reference voltage for amplifier 240.

The output of amplifier 240 can be coupled to an ADC. The amplifier output may be coupled to the ADC through a low pass filter. Resistor 248 is coupled to the output of amplifier 240 and to one terminal of capacitor 250. The other terminal of capacitor 250 is coupled to ground. Together, resistor 248 and capacitor 250 make a low pass filter for the output of amplifier 240. The node where resistor 248 and capacitor 250 are coupled together provides a signal 252 that may be coupled to the ADC.

PREF 280 and GREF 294 are the nodes supplying the input reference voltages for amplifier 220 and amplifier 240, respectively. They are derived from $V_{DD}$ 290. $V_{DD}$ 290 is a reference voltage supplied by an internal voltage regulator. In one embodiment, the voltage at $V_{DD}$ 290 is 2.3 volts. One terminal of a resistor 282 is coupled to $V_{DD}$ 290 and the other terminal is coupled to the PREF node 280.

One terminal of a resistor 286 is coupled to the PREF node 280 and the other terminal is coupled to the drain terminal of a transistor 296. The source terminal of the transistor 296 is coupled to ground. The gate terminal of the transistor 296 is coupled to an amplifier enable signal 292 which turns the transistor 296 on or off to prevent current draw from $V_{DD}$ 290 when amplifiers 220 and 240 are off.

The voltage at the PREF node 280, which is the input reference voltage for the first stage amplifier 220, is derived by dividing the voltage from the output of an internal voltage regulator, $V_{DD}$ 290. This input reference voltage at the PREF node 280 allows the output of the first stage amplifier 220 to remain in linear operation and avoid saturation even with no input signal. The voltage at the GREF node 294, which is the input reference voltage for the second stage amplifier 240, is derived by further dividing the voltage at the PREF node 280. Because the second reference voltage at the GREF node 294 is generated by dividing the first reference voltage at the PREF node 280, the GREF node 294 is ensured to be at a lower voltage than the PREF node 280. This ensures that the output of the second stage amplifier 240 is above the first reference voltage and any offset introduced by amplifier 220 and amplifier 240. As a result, both amplifier 220 and amplifier 240 should remain in the linear operating region no matter what amplifier gain is selected.

The voltage at the PREF node 280 is set by the voltage divider made up of resistor 282 and resistor 286 dividing the voltage of $V_{DD}$ 290. The voltage at the GREF node 294 is set by the voltage divider made up of the sum of the resistance values of resistor 282 and resistor 284 compared to the resistance value of resistor 288. In one embodiment, the voltage at $V_{DD}$ 290 is 2.3V, resistor 282 is 200K, resistor 286 is 5K, resistor 284 is 4.44K and resistor 288 is 40K. With these values, PREF 280 will be 50 mV and GREF 294 will be 45 mV. Therefore, the difference in voltage between PREF 280 and GREF 294 is 5 mV in this embodiment.

A voltage difference of 5 mV was chosen for this example because 5 mV may be expected in some cases to be the worst case offset voltage between the inverting and noninverting terminals of the amplifiers 220 and 240. A voltage difference of 5 mV between the two reference voltages may be desirable in some embodiments because choosing a lower voltage difference may not adequately reduce the offset, and choosing a higher voltage difference could reduce the dynamic range of the amplifier output in some embodiments. However, in other embodiments, it may be desirable for the voltage difference between PREF 280 and GREG 284 to be larger or smaller than 5 mV.

The resistance values given in this example are just one possible embodiment. Different resistance values than those in this example may be chosen to achieve a different voltage gain for amplifier 220 or amplifier 240. Different resistance values than those given in this example may also be used to generate different reference voltages at the PREF node 280 or the GREF node 284.

For the purposes of this disclosure, if an element is referred to as being "coupled" to another element, it may be directly coupled to the other element, or intervening elements may exist. If an element is referred to as being "directly coupled" to another element, no other intervening elements are intentionally disposed. The terms "substantially the same," "substantially equal," and "approximately the same" describe a quantitative relationship between two objects. This quantitative relationship may prefer the two objects to be equal by design but with the anticipation that a certain amount of variations can be introduced by the fabrication process.

While operations are depicted in the drawings in a particular order, this should not be understood as requiring that all illustrated operations be performed to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. An integrated circuit comprising:
    a first voltage source;
    a first amplifier having a noninverting input, an inverting input, and an output, the noninverting input is adapted to be coupled to a signal from an anode of a photodiode and is coupled to the first voltage source, and the inverting input is adapted to be coupled to a cathode of the photodiode;
    a first resistor having one terminal coupled to the inverting input of the first amplifier and another terminal coupled to the output of the first amplifier;
    a first capacitor having one terminal coupled to the inverting input of the first amplifier and another terminal coupled to the output of the first amplifier;
    a second voltage source different from the first voltage source;
    a second amplifier having a noninverting input, an inverting input and an output, the noninverting input is coupled to the output of the first amplifier, and the inverting input is coupled to the second voltage source; and
    a second resistor having one terminal coupled to the inverting input of the second amplifier and another terminal coupled to the output of the second amplifier.

2. The integrated circuit of claim 1, in which the first voltage source is coupled to the noninverting input of the first amplifier through a third resistor, and the second voltage source is coupled to the inverting input of the second amplifier through a fourth resistor.

3. The integrated circuit of claim 2, in which the first voltage source is generated by a voltage divider circuit that includes a fifth resistor having one terminal coupled to a third voltage source and another terminal coupled to the first voltage source, and a sixth resistor having one terminal coupled to the first voltage source and another terminal coupled to ground.

4. The integrated circuit of claim 3, in which the second voltage source is generated by a voltage divider circuit that includes a seventh resistor having one terminal coupled to the first voltage source and another terminal coupled to the second voltage source, and an eighth resistor having one terminal coupled to the seventh resistor and another terminal coupled to ground.

5. The integrated circuit of claim 4, in which the sixth resistor and the eighth resistor are coupled to ground through a transistor.

6. The integrated circuit of claim 1, in which a ninth resistor is coupled between the inverting terminal and the noninverting terminal of the first stage amplifier.

7. The integrated circuit of claim 6, in which a second capacitor is coupled between the inverting terminal and the noninverting terminal of the first stage amplifier.

8. The integrated circuit of claim 2, in which there is a third capacitor coupled in parallel with the third resistor.

9. The integrated circuit of claim 8, in which there is a tenth resistor having a first terminal coupled to the output of the second amplifier and a second terminal.

10. The integrated circuit of claim 9, in which there is a fourth capacitor having one terminal coupled to ground and the other terminal coupled to the second terminal of the tenth resistor.

11. The integrated circuit of claim 4, in which the first voltage source is higher in voltage than the second voltage source.

12. The integrated circuit of claim 11, in which the difference in voltage between the first voltage source and the second voltage source is 5 mV.

13. The integrated circuit of claim 2, in which the second resistor is a variable resistor.

14. A process comprising:
receiving a first signal from a cathode of a photodiode at an inverting input of a first amplifier;
receiving a second signal from an anode of the photodiode at a noninverting input of the first amplifier;
coupling a first voltage source to the noninverting input of the first amplifier;
receiving an output of the first amplifier at a noninverting input of a second amplifier;
coupling a second voltage source different from the first voltage source to an inverting input of the second amplifier.

15. The process of claim 14, in which the first voltage source is derived by coupling one terminal of a first resistor to a third voltage source and the other terminal to the first voltage source, and coupling one terminal of a second resistor to the first voltage source and the other terminal to ground.

16. The process of claim 15, in which the second voltage source is derived by coupling one terminal of a third resistor to the first voltage source and the other terminal to the second voltage source, and coupling one terminal of a fourth resistor to the second voltage source and the other terminal to ground.

17. The process of claim 16, in which the second resistor and the fourth resistor are coupled to ground through a transistor.

18. The process of claim 17, in which the transistor is turned off when the first amplifier and the second amplifier are off.

19. The process of claim 14, in which an output of the second amplifier is low pass filtered.

20. The process of claim 14, in which the second amplifier is a variable gain amplifier.

* * * * *